United States Patent [19]
Wahl et al.

[11] Patent Number: 6,111,746
[45] Date of Patent: Aug. 29, 2000

[54] COMPUTER PROCESSOR MODULE GROUND/EMI-SHIELD SPRING CLIP AND METHOD

[75] Inventors: Rick Wahl, Cedar Park; Steve Gluskoter, Austin, both of Tex.

[73] Assignee: Dell USA, L.P., Round Rock, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/976,164

[22] Filed: Nov. 21, 1997

[51] Int. Cl.⁷ .............................. H05K 5/00; H05K 9/00; G06F 1/16
[52] U.S. Cl. ................. 361/684; 361/818; 174/35 GC
[58] Field of Search .................................. 361/684, 683, 361/753, 756, 759, 799, 800, 801, 802, 816, 818, 686, 754; 174/35 R, 35 GC, 51, 40 CC; 403/329, 393; 411/174, 175

[56] References Cited

U.S. PATENT DOCUMENTS

| | | | |
|---|---|---|---|
| 4,598,962 | 7/1986 | Reitz et al. | 361/684 |
| 4,710,852 | 12/1987 | Keen . | |
| 4,855,873 | 8/1989 | Bhargava et al. | 361/818 |
| 5,015,802 | 5/1991 | Chi | 174/35 GC |
| 5,124,889 | 6/1992 | Humbert et al. | 361/424 |
| 5,138,529 | 8/1992 | Colton et al. | 361/424 |
| 5,311,408 | 5/1994 | Ferchau et al. . | |
| 5,319,524 | 6/1994 | Welch et al. | 361/754 |
| 5,331,507 | 7/1994 | Kyung et al. . | |
| 5,490,043 | 2/1996 | Tan et al. | 361/818 |
| 5,502,620 | 3/1996 | Funck et al. | 361/753 |
| 5,526,874 | 6/1996 | White . | |
| 5,537,294 | 7/1996 | Siwinski | 361/753 |
| 5,545,843 | 8/1996 | Arvidsson et al. | 174/35 GC |
| 5,625,227 | 4/1997 | Estes et al. . | |
| 5,673,176 | 9/1997 | Penniman et al. . | |
| 5,761,033 | 6/1998 | Wilhelm | 361/686 |
| 5,847,924 | 12/1998 | Youn | 361/686 |

FOREIGN PATENT DOCUMENTS

| | | | |
|---|---|---|---|
| 2050851 | 3/1992 | Canada | 361/818 |
| 2257839 | 1/1993 | United Kingdom | 361/818 |

OTHER PUBLICATIONS

U.S. application No. 08/959,185, filed Oct. 28, 1997, Jeffries et al., *Heat Sink Fastener Retention Apparatus and Method for Computer Systems*, Abstract and 7 sheets of drawings.

Primary Examiner—Harshad Patel
Assistant Examiner—Jagdish Patel
Attorney, Agent, or Firm—Haynes and Boone, LLP

[57] ABSTRACT

A computer system includes a processor module having a clip mounted on a peripheral edge of the module. The clip includes a body which has an elongated channel portion for gripping the peripheral edge. On each end of the channel portion, a clamp is provided. The clamps each have ground contacts and locating dimples for engaging screw holes formed in the module. The channel portion also includes at least one leg member extending therefrom for contact with a surface of the computer chassis which houses the module. The ground contacts extend from the clamps and engage ground surfaces in the chassis.

2 Claims, 6 Drawing Sheets

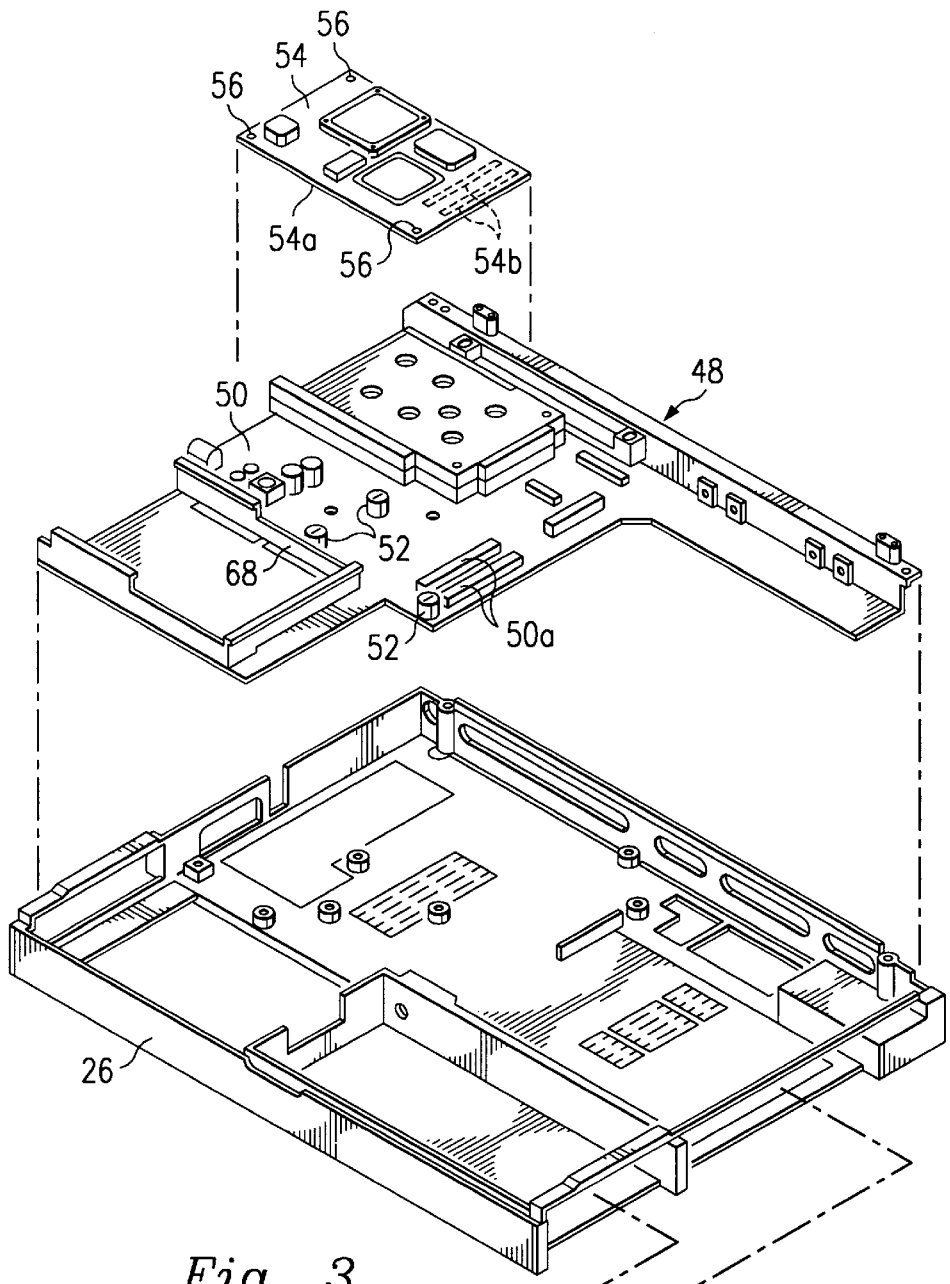
Fig. 3
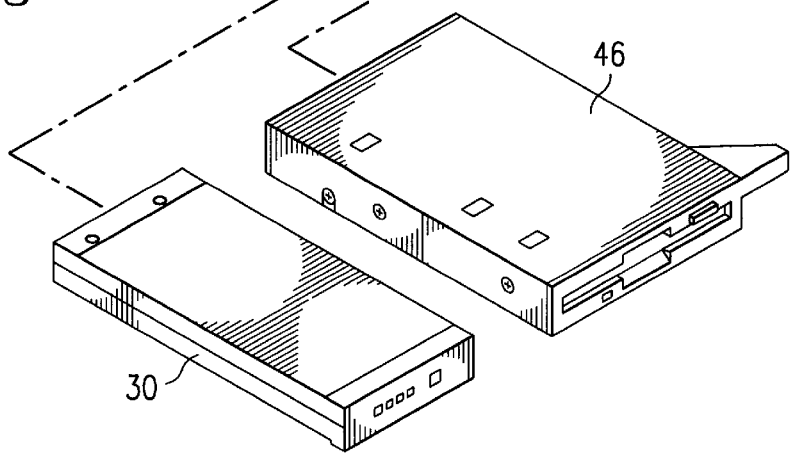

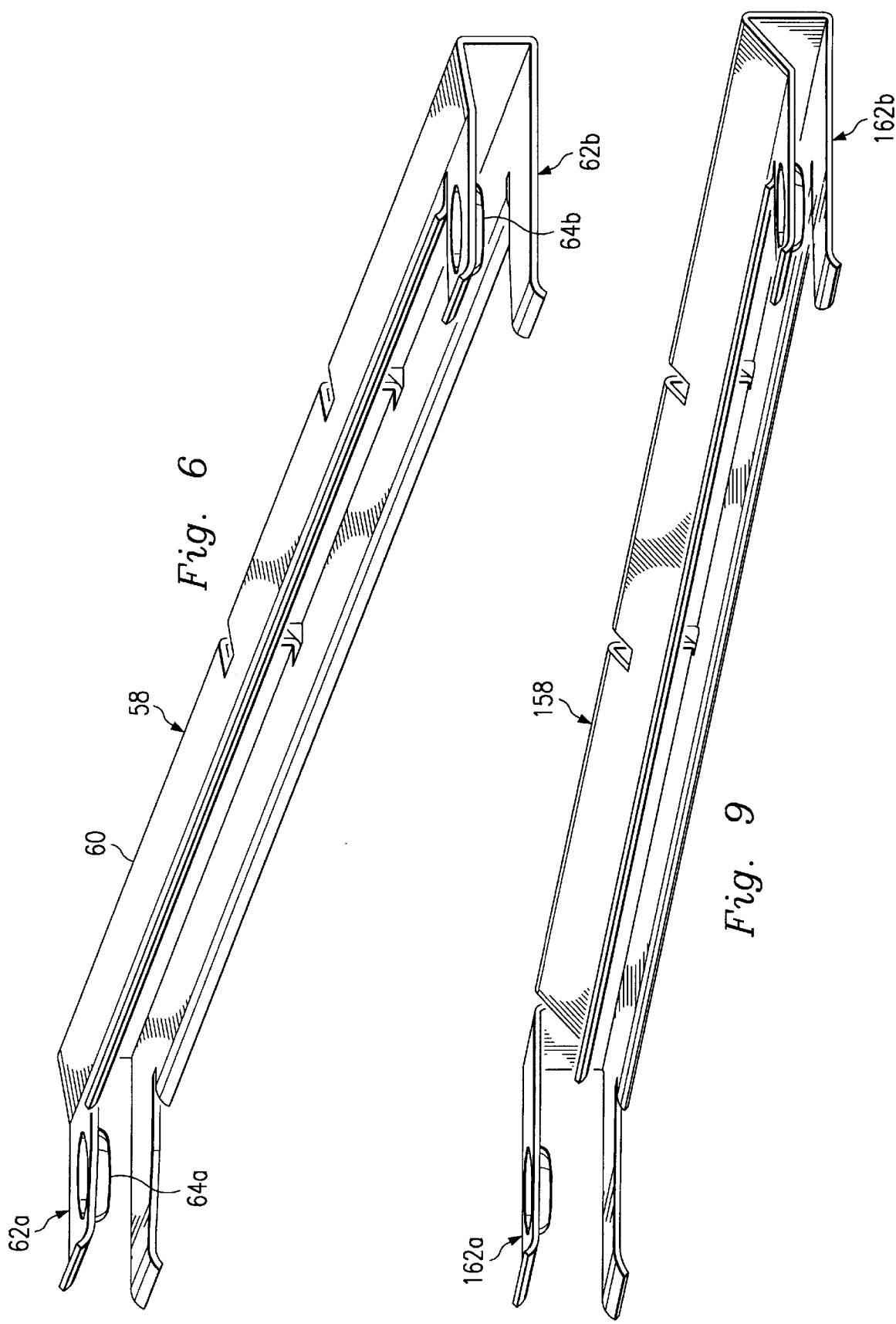

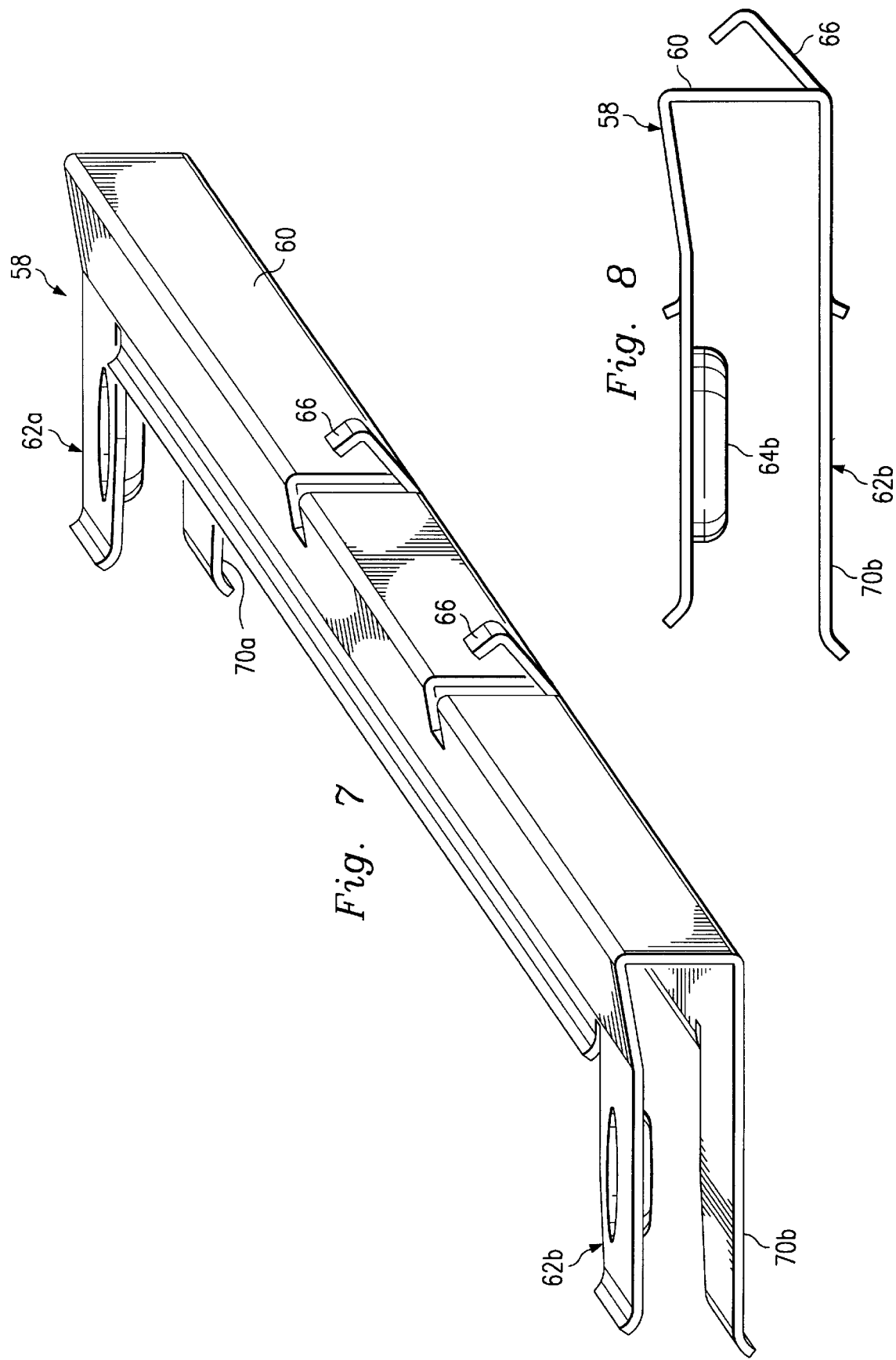

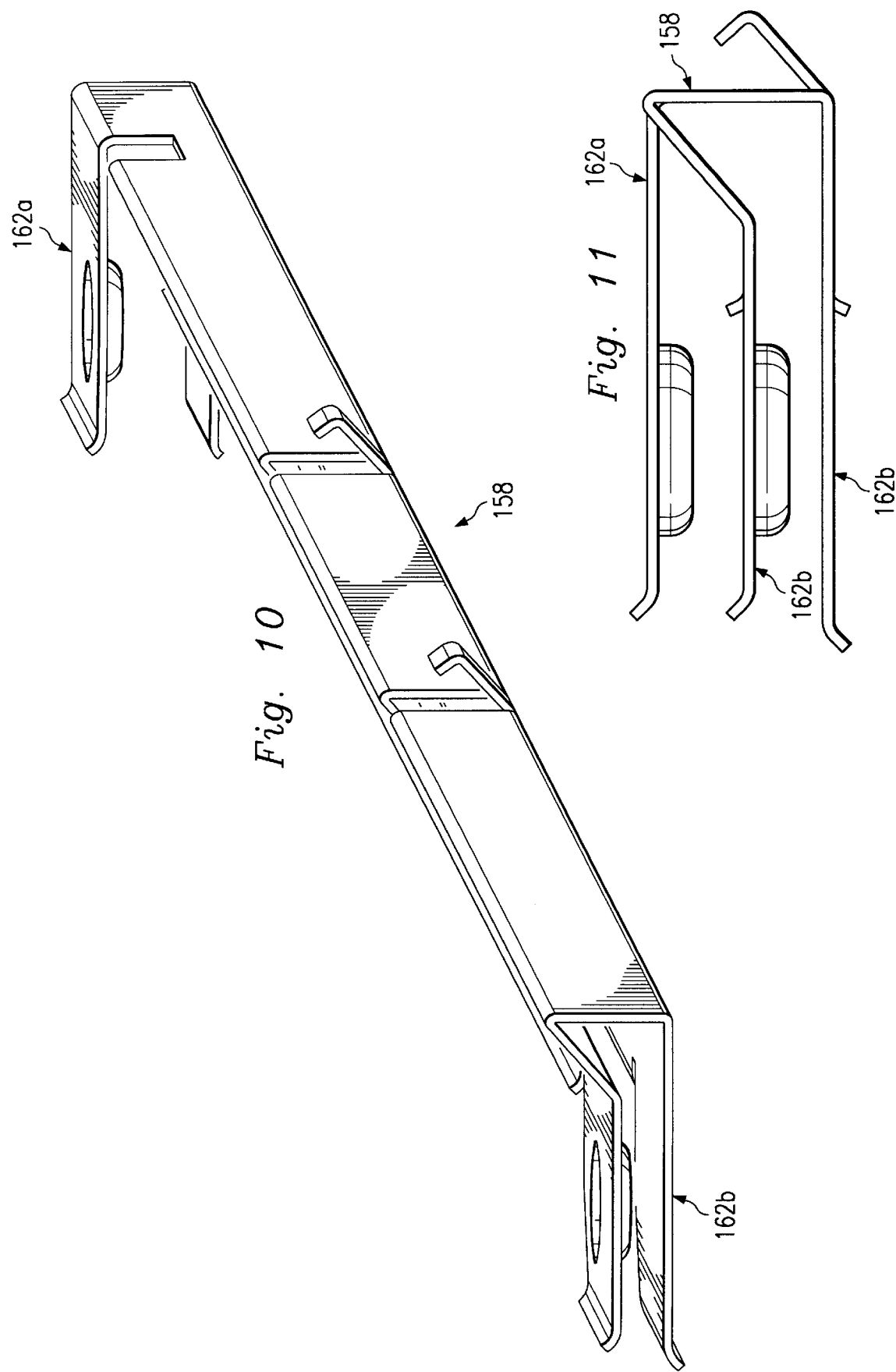

6,111,746

COMPUTER PROCESSOR MODULE GROUND/EMI-SHIELD SPRING CLIP AND METHOD

BACKGROUND

The disclosures herein relate generally to computer systems and more particularly to a clip mounted on a processor module within the system for providing a ground contact and EMI shielding.

During the manufacture of a computer, components are mounted in a chassis. In the case of a portable notebook computer, for example, a top including a display screen is pivotally attached at a hinge to a chassis base. Major components within the chassis base include a motherboard, a processor module, drives for hard disk and CD ROM, PCMCIA card slots, and external connectors, all of which are well known. A keyboard is mounted on an upper surface of the chassis base.

It is sometimes necessary to service or upgrade the components in the chassis base. Many of the components are screw mounted within the chassis and removal and replacement is time consuming, i.e. labor intensive. Also, in the manufacturing processes, installation of the components is labor intensive. As a result, preassembled manufacture of a basic chassis configuration for sale to various computer companies is not uncommon. Thus, these basic configurations all contain common components.

A problem with such an arrangement is that the processor module is one of the components which a computer company may wish to customize or upgrade prior to selling the computer. Therefore, in order to access the processor module, partial disassembly of the basic preassembled chassis configuration is required. This may involve removal of several screws which provide a ground contact and are mounted on standoffs adjacent the motherboard. In order to access the screws, several portions of the chassis may also require removal. Upon installation of the upgraded processor module, the chassis requires re-assembly.

Another disadvantage of purchasing pre-assembled chassis is that the preassembler purchases the components which are installed which adds to the cost of the components. Furthermore, later service or upgrade for the components requires substantial disassembly of the chassis often including removal of the hinged top so that components can be accessed.

Therefore, what is needed is a processor module which is easily accessible without substantial disassembly of the computer chassis, and which can be easily removed and replaced in either initial manufacturing or for subsequent service or upgrade.

SUMMARY

One embodiment, accordingly, includes an apparatus and a method for providing easy insertion and removal of a processor module by reducing the number of screw connections required to secure the processor module in the chassis. To this end, a clip is provided for mounting a processor module in a computer chassis. The clip comprises a body having a gripping portion formed thereon. A clamp is provided on each opposite end of the gripping portion. Each clamp includes ground contacts.

A principal advantage of this embodiment is that the clip easily engages an edge portion of the processor module. In addition to providing ground contact, EMI/RFI shielding is enhanced because the clip contacts an adjacent portion of the chassis.

BRIEF DESCRIPTION OF DRAWINGS

FIG. 3 is an exploded isometric view illustrating an embodiment of a base portion of a portable computer.

FIG. 6 is an isometric frontal view illustrating an embodiment of the clip.

FIG. 7 is an isometric rear view illustrating the clip of FIG. 6.

FIG. 8 is an end view illustrating the clip of FIG. 6.

FIG. 9 is an isometric frontal view illustrating another embodiment of the clip.

FIG. 10 is an isometric rear view illustrating the clip of FIG. 9.

FIG. 11 is an end view illustrating the clip of FIG. 9.

DETAILED DESCRIPTION OF THE PREFERRED EMBODIMENT

Figure 1:
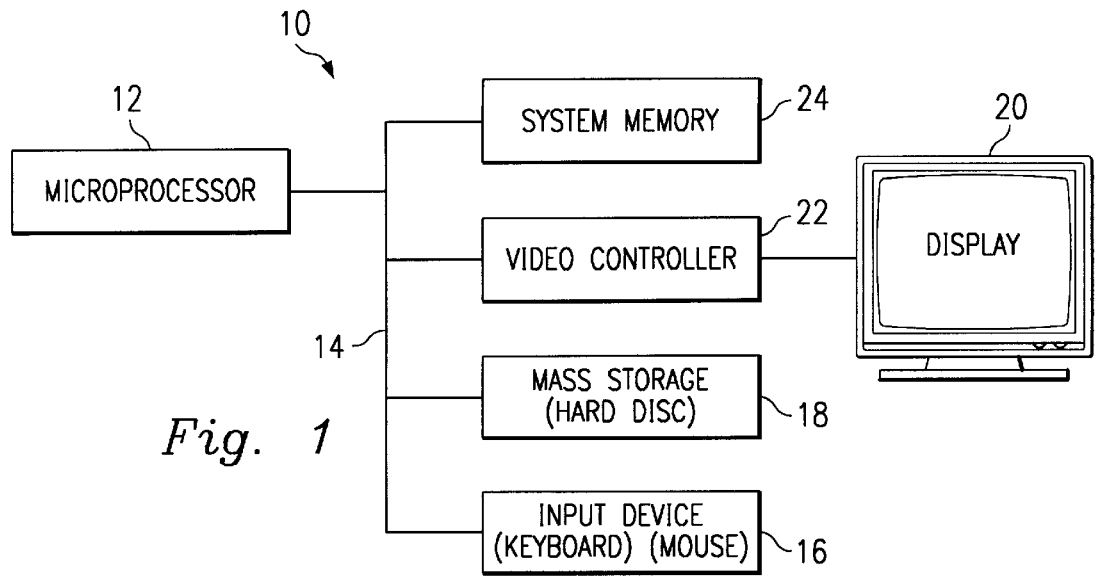
FIG. 1 is a diagrammatic view illustrating an embodiment of a typical computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
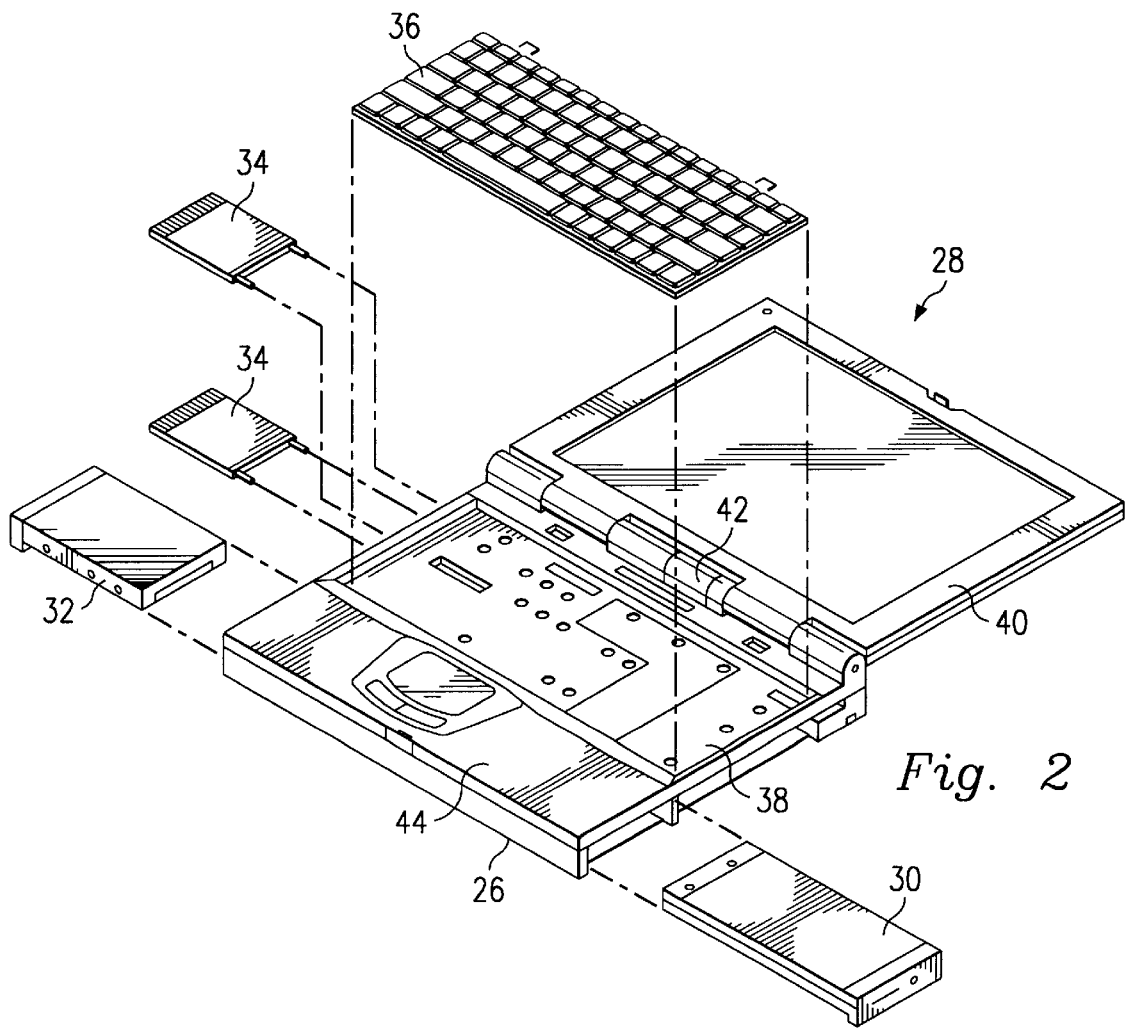
FIG. 2 is an exploded isometric view illustrating an embodiment of a portable computer.

In FIG. 2 a chassis base 26 of system 10 is provided in this example, as part of a portable notebook computer generally designated 28. Included in chassis base 26 are well known removable components such as a battery pack 30, a hard disk drive 32 and PCMCIA cards 34. A keyboard 36 is removed from base 26 and exposes a thermal plate 38 seated directly below the keyboard 36. A top portion 40 is attached at a hinge 42 and includes the display 20. A cover plate 44 is mounted on chassis base 26 adjacent the keyboard 36.

Chassis base 26, FIG. 3, includes battery pack 30 a floppy drive 46, and a motherboard assembly 48 including a motherboard 50. Mounted on the motherboard 50 are a pair of connectors 50a and a plurality of standoffs 52 which are provided as mounting supports for a processor module 54. Standoffs 52 permit the processor module 54 to be mounted in an elevated position above the motherboard 50. This is accomplished in part by extending multiple screws (not shown) through screw apertures 56, one being formed in each of three corners of processor module 54. The screws can be threadably received by the standoffs 52.

Figure 4:
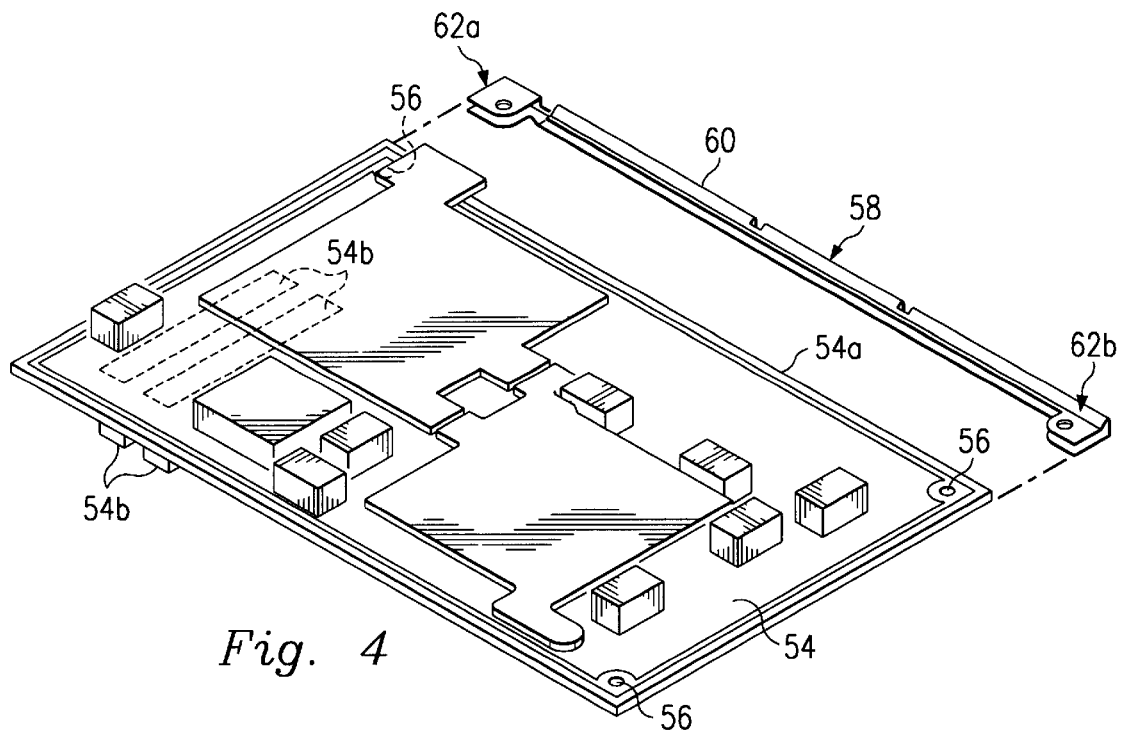
FIG. 4 is an isometric view illustrating an embodiment of a processor module and an associated clip detached therefrom.

Processor module 54, FIG. 4, can advantageously be mounted on motherboard 50 without the need for the screws mentioned above. This is accomplished by attaching a clip 58 on a peripheral edge 54a of processor module 54. Clip 58 includes a body having an elongated gripping portion 60 in the form of a channel. A first clamp 62a is formed on one end 60a of the gripping channel portion 60 and a second clamp 62b is formed on another end 60b, opposite the one end 60a. Processor module 54, includes well known components mounted thereon including a pair of connectors 54b, for mated engagement with motherboard connectors 50a, see also FIG. 3. Screw apertures 56 are provided in at least three corners thereof for receiving mounting screws as aforesaid.

Figure 5:
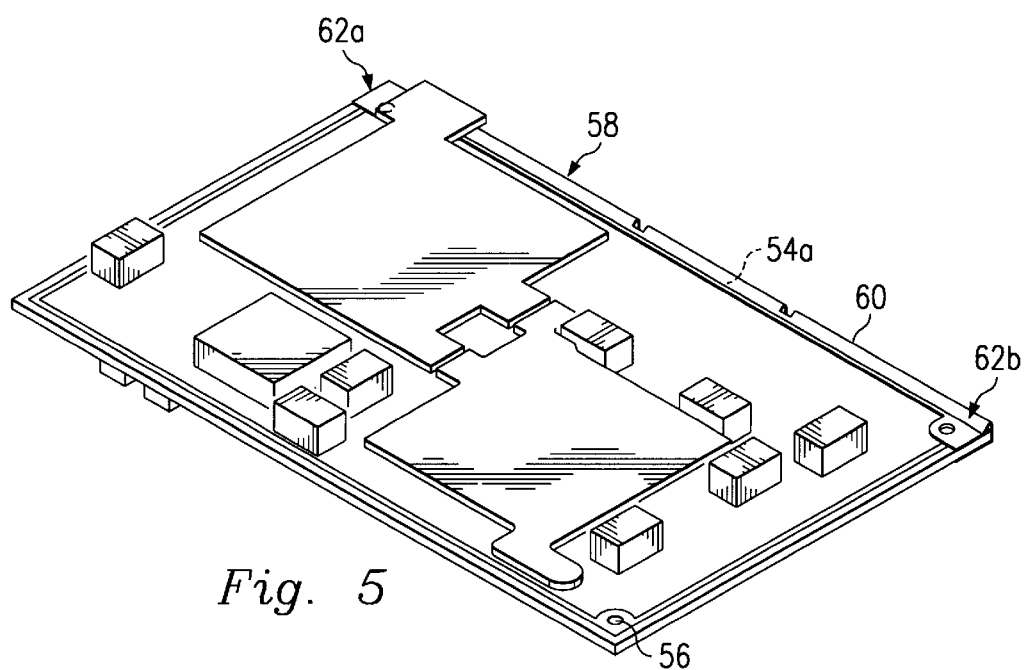
FIG. 5 is an isometric view illustrating an embodiment of a processor module and an associated clip mounted thereon.

Each clamp 62a, 62b includes a locating dimple, 64a, 64b, FIG. 6, respectively for engaging two of the screw apertures 56, FIG. 4, when clip 58 is urged onto peripheral edge 54a so that channel portion 60 grips the edge 54a, FIG. 5. This leaves one of the screw apertures 56, exposed.

A pair of resilient leg members 66, FIG. 7, extend from gripping portion 60, to provide contact between clip 58 and a portion of chassis base 26 such as a fence member 68, FIG. 3 defining a receptacle for the hard disk drive 32, FIG. 2. In addition, each clamp 62a, 62b includes a flat or planar portion 70a, 70b, FIGS. 7, 8, for providing contact between clip 58 and standoffs 52, see also FIG. 3.

In an alternative embodiment, FIGS. 9, 10 and 11, in order to accommodate a corner portion of processor module 54 being of increased thickness due to components mounted thereon, a clip 158 may include one of the clamps 162a formed with a greater spacing than the other clamp 162b, so as to accommodate the varying thickness between the respective corner portions. However, in structure and function, other physical aspects of clips 158 remain the same as clip 58.

In operation, clamp 58 is urged onto edge 54a of processor module 54 so that gripping channel portion 60 engages edge 54a and clamps 62a, 62b engage opposite corners of processor module 54 adjacent two of the screw apertures 56. When clip 58 is properly seated on edge 54a, locating dimples 64a, 64b snap into the two screw apertures 56 adjacent edge 54a. Processor module 54 is seated on motherboard 50 such that connectors 54b of processor module 54 engage connectors 50a of motherboard 50. This engagement positions edge 54a of processor module 54, which includes clip 58, adjacent chassis fence 68. As a result, resilient leg members 66 of gripping channel portion 60, are urged into contact with fence 68. Also, portions 70a, 70b of clamps 62a, 62b, respectively, are urged into contact with their adjacent standoffs 52. A single screw (not shown) can be extended through exposed screw aperture 56 and into a remaining adjacent one of the standoffs 52. For removal of processor module 54, the one screw is removed and the processor module 54 is lifted off of the motherboard 50 thus disconnecting the connectors 50a, 54b.

As it can be seen, the principal advantages of these embodiments are that a processor module is mounted in a computer chassis in a manner which requires minimal use of screws for securing the module. This reduces the amount of manufacturing time and service time for disassembly of the chassis required to replace the module. Both ground contact and EMI/RFI shielding are maintained and/or enhanced due to expanded contact points between the module and the chassis. Also, pre-assembly of the basic chassis hardware does not have to include the processor module, allowing the final assembly to upgrade or customize the computer by easily installing a particular processor module without the need for any significant disassembly of the pre-assembled unit.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An electronic device comprising:
   a chassis including a fence member;
   a motherboard mounted in the chassis adjacent the fence member the motherboard including a plurality of standoffs mounted thereon;
   a processor module mounted on the motherboard and supported by the standoffs, the processor module including a plurality of edge portions and a plurality of opposite corners, at least three of the corners having a screw aperture formed therein;
   a clip providing a ground/EMI shield for the processor module, the clip including a body having an elongated gripping portion forming a channel mounted on one of the edge portions of the processor module;
   a first clamp formed on one end of the gripping portion and extending in a first direction;
   a second clamp formed on another end of the gripping portion opposite the one end and extending in the first direction;
   each of the first and second clamps including a locating dimple spaced apart from and opposite a flat portion, the locating dimple on the first clamp being in one of the screw apertures, and the locating dimple on the second clamp being in another of the screw apertures, the flat portion of the first clamp being engaged with one of the standoffs, and the flat portion of the second clamp being engaged with another of the standoffs; and
   a plurality of resilient leg members extending in a second direction from the gripping portion opposite the first direction, the leg members being engaged with the fence member.

2. A computer system comprising:
   a chassis including a fence member;
   at least one microprocessor mounted in the chassis;
   at least one input coupled to provide input to the microprocessor;
   at least one storage coupled to the microprocessor;
   at least one memory coupled to provide storage to facilitate execution of computer programs by the microprocessor;
   a motherboard mounted in the chassis adjacent the fence member, the motherboard including a plurality of standoffs mounted thereon;
   a processor module mounted on the motherboard and supported by the standoffs, the processor module including a plurality of edge portions and a plurality of opposite corners, at least three of the corners having a screw aperture formed therein;
   a clip providing a ground/EMI shield for the processor module, the clip including a body having an elongated gripping portion forming a channel mounted on one of the edge portions of the processor module;
   a first clamp formed on one end of the gripping portion and extending in a first direction;
   a second clamp formed on another end of the gripping portion opposite the one end and extending in the first direction;

each of the first and second clamps including a locating dimple spaced apart from and opposite a flat portion, the locating dimple on the first clamp being in one of the screw apertures, the locating dimple on the second clamp being in another of the screw apertures, the flat portion of the first clamp being engaged with one of the standoffs, and the flat portion of the second clamp being engaged with another of the standoffs; and a plurality of resilient leg members extending in a second direction from the gripping portion, opposite the first direction, the leg members being engaged with the fence member.

* * * * *